(12) United States Patent
Doyle

(10) Patent No.: US 8,230,784 B2
(45) Date of Patent: Jul. 31, 2012

(54) METHOD AND APPARATUS FOR CALIBRATING PRINT HEAD PRESSURE AND APPLYING AN ACCURATE PRINT PRESSURE DURING PRODUCTION

(75) Inventor: Dennis G. Doyle, Shrewsbury, MA (US)

(73) Assignee: Illinois Took Works Inc., Glenview, IL (US)

( * ) Notice: Subject to any disclaimer, the term of this patent is extended or adjusted under 35 U.S.C. 154(b) by 5 days.

(21) Appl. No.: 12/889,010

(22) Filed: Sep. 23, 2010

(65) Prior Publication Data

US 2011/0011288 A1 Jan. 20, 2011

Related U.S. Application Data

(62) Division of application No. 11/786,971, filed on Apr. 13, 2007, now Pat. No. 7,806,048.

(51) Int. Cl.
*B41M 1/12* (2006.01)
(52) U.S. Cl. ......... 101/129; 101/484; 101/123
(58) Field of Classification Search ............ 101/123, 101/124, 126, 129, 484, 485, 486
See application file for complete search history.

(56) References Cited

U.S. PATENT DOCUMENTS

| | | | |
|---|---|---|---|
| 5,052,291 A | 10/1991 | Takahashi et al. | |
| 5,078,063 A | 1/1992 | Johansen et al. | |
| 5,170,656 A | 12/1992 | Draus | |
| 5,273,717 A | 12/1993 | Marvin | |
| 5,440,980 A | 8/1995 | Murakami et al. | |
| 5,479,854 A | 1/1996 | Chikahisa et al. | |
| 5,996,487 A | 12/1999 | Tomomatsu et al. | |
| 6,105,495 A | 8/2000 | Takahashi et al. | |
| 6,112,656 A | 9/2000 | Asai et al. | |
| 6,324,973 B2 | 12/2001 | Rossmeisl et al. | |
| 6,397,741 B1 | 6/2002 | Curtin | |
| 6,619,198 B2 | 9/2003 | Rossmeisl et al. | |
| 6,626,097 B2 | 9/2003 | Rossmeisl et al. | |
| 6,955,120 B2 | 10/2005 | Pham-Van-Diep et al. | |
| 7,249,558 B2 | 7/2007 | Claiborne | |
| 7,806,048 B2 | 10/2010 | Doyle | |

*Primary Examiner* — Ren Yan
(74) *Attorney, Agent, or Firm* — Lando & Anastasi, LLP

(57) ABSTRACT

A stencil printer includes a frame, a stencil coupled to the frame, a substrate support coupled to the frame to support a substrate in a print position, and a print head, coupled to the frame, to deposit and print viscous material over the stencil. The print head includes a squeegee assembly having at least one squeegee blade and a squeegee blade movement mechanism configured to move the squeegee blade from a raised position in which the squeegee blade is spaced from stencil and a lowered position in which the squeegee blade engages and applies a force on the stencil. The print head further has a device to detect a first reference point associated with a first force of the squeegee blade against the stencil and a second reference point associated with a second force of the squeegee blade against the stencil when moving the squeegee blade to the lowered position in which the squeegee blade engages and applies a force on the stencil.

4 Claims, 7 Drawing Sheets

METHOD AND APPARATUS FOR CALIBRATING PRINT HEAD PRESSURE AND APPLYING AN ACCURATE PRINT PRESSURE DURING PRODUCTION

CROSS-REFERENCE TO RELATED APPLICATIONS

This application is a divisional of U.S. patent application Ser. No. 11/786,971, filed Apr. 13, 2007, entitled METHOD AND APPARATUS FOR CALIBRATING PRINT HEAD PRESSURE AND APPLYING AN ACCURATE PRINT PRESSURE DURING PRODUCTION, which is currently pending and incorporated herein by reference for all purposes.

BACKGROUND OF THE INVENTION

1. Field of Invention

The invention relates generally to methods and apparatus for printing viscous material, such as solder paste, onto a substrate, such as a printed circuit board, and more particularly to a method and apparatus for calibrating the pressure or force of squeegee blades of a print head on a stencil, and for applying an accurate print pressure during production.

2. Discussion of Related Art

In a typical surface-mount circuit board manufacturing operation, a stencil printer is used to print solder paste onto a printed circuit board. A circuit board, broadly referred to as an electronic substrate, having a pattern of pads or some other conductive surface onto which solder paste will be deposited, is automatically fed into the stencil printer. One or more small holes or marks on the circuit board, called fiducials, is used to align the circuit board with the stencil or screen of the stencil printer prior to the printing of solder paste onto the circuit board. The fiducials serve as reference points when aligning a circuit board to the stencil. Once a circuit board has been aligned with the stencil in the printer, the circuit board is raised to the stencil by a substrate support, e.g., a table having pins or other work holders, and fixed with respect to the stencil. Solder paste is then dispensed by moving a wiper blade or squeegee across the stencil to force the solder paste through apertures formed in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste is typically dispensed onto the stencil from a standard solder paste supply cartridge. After the print operation, the board is then released, lowered away from the stencil, and transported to another station within the printed circuit board fabrication line.

During a print cycle, as described above, the squeegee is moved across the stencil to force solder paste or any other viscous material through apertures formed in the stencil. FIG. 1 schematically illustrates the connection of a squeegee blade to a print head. As shown, a squeegee blade 40 is secured to a squeegee blade holder 64 in a position in which the squeegee blade may be disposed at an angle with respect to a stencil 18. The print head includes a first movable plate 54 and a second movable plate 56 that is connected to the first movable plate. The first movable plate 54 is secured to a frame (not shown) of the print head by two linear bearings indicated at 57 and driven by a lead screw 58, which is driven by a motor (not shown) provided in the print head. The arrangement is such that the lead screw threadably engages a lead nut 60 secured to the first movable plate to move the first and second movable plates 54, 56 along a path defined by the linear bearings 57. The second movable plate 56 includes a blade holder 64 to secure the squeegee blade 40 to the second movable plate. As shown, a compression spring 62 is disposed around the lead screw 58 to provide a resistance force between the first movable plate 54 and the second movable plate 56.

One issue with printing is calibrating the force upon which the squeegee blade 40 engages the stencil 18. Specifically, the spring constant of the compression spring 62 may vary. Also, when using a flexible (non-rigid) squeegee blade, the spring constant of the squeegee blade may effect the force upon which the blade engages the stencil 18. With reference to FIG. 1, a sensor 52 may be provided to a home position and/or a distance of the first movable plate 54 with respect to the frame of the print head. With the known calibration methods, e.g., replacing the squeegee blade 40 with a calibration gauge, the force of the blade against the stencil is determined by moving the first movable plate 54 a known distance, which is dependent upon the spring constant of the compression spring 62. Thus, if a customer has a completely rigid squeegee blade, the force of the blade against the stencil is somewhat accurate. It is difficult to determine the force of the squeegee blade against the stencil when the blade is flexible or when the spring constant of the compression spring is not to tolerance.

BRIEF SUMMARY OF THE INVENTION

Embodiments of the invention provide improvements to stencil support assemblies, such as those described above.

A first aspect of the invention is directed to a stencil printer for printing viscous material on a substrate. The stencil printer comprises a frame, a stencil coupled to the frame, a substrate support coupled to the frame to support a substrate in a print position, and a print head, coupled to the frame, to deposit and print viscous material over the stencil. The print head comprises a squeegee assembly comprising at least one squeegee blade and a squeegee blade movement mechanism configured to move the at least one squeegee blade from a raised position in which the at least one squeegee blade is spaced from stencil and a lowered position in which the at least one squeegee blade engages and applies a force on the stencil. The print head further comprises a device to detect a first reference point associated with a first force of the at least one squeegee blade against the stencil and a second reference point associated with a second force of the at least one squeegee blade against the stencil when moving the at least one squeegee blade to the lowered position.

Embodiments of the stencil printer may further be directed to having the at least one squeegee blade movement mechanism comprising a first movable member coupled to the frame of the stencil printer and a second movable member coupled to the first movable member and to the at least one squeegee blade. The squeegee blade movement mechanism further comprises a lead screw housed by the frame of the stencil printer and a lead nut secured to the first movable member and threadably engaged with the lead screw to move the first and second movable members so as to move the at least one squeegee blade between the raised and lowered positions. The squeegee blade movement mechanism further comprises a compression spring disposed around the lead screw to provide a resistance force between the first movable member and the second movable member. The arrangement is such that when moving the at least one squeegee blade to the lowered position against the stencil so as to apply a force on the at least one squeegee blade, the second movable member moves toward the first movable member against the resistance of the compression spring. The second movable member includes a squeegee blade holder to secure the at least one squeegee blade to the second movable member. The device comprises a flag secured to one of the first movable member and the second movable member and a sensor secured to the other of the first movable member and the second movable member. The sensor is configured to detect at least two features of the flag when moving the at least one squeegee blade to a position of an applied force from the lowered position. The first and second reference points are associated with the at least two features of the flag. A gauge, which replaces the at least one squeegee blade, is provided to measure a force of the gauge against the stencil. The gauge is configured to measure a simulated force of the at least one squeegee blade against the stencil when the first reference point of the flag is detected by the sensor and when the second reference point of the flag is detected by the sensor.

Another aspect of the invention is directed to a stencil printer for printing viscous material on a substrate. The stencil printer comprises a frame, a stencil coupled to the frame, a substrate support coupled to the frame to support a substrate in a print position, and a print head, coupled to the frame, to deposit and print viscous material over the stencil. The print head comprise at least one squeegee blade, a first movable member coupled to the frame of the stencil printer, a second movable member coupled to the first movable member and to the at least one squeegee blade, the first and second movable members being configured to move the at least one squeegee blade from a raised position in which the at least one squeegee blade is spaced from stencil and a lowered position in which the at least one squeegee blade engages and applies a force on the stencil, a flag secured to one of the first movable member and the second movable member, and a sensor secured to the other of the first movable member and the second movable member. The sensor is configured to detect the flag when moving the at least one squeegee blade. The flag and sensor is configured to detect a first reference point associated with a first force of the at least one squeegee blade against the stencil and a second reference point associated with a second force of the at least one squeegee blade against the stencil when moving the at least one squeegee blade to the lowered position.

A further aspect of the invention is directed to a method of calibrating a squeegee blade force against a surface. The method comprises: moving a gauge in a downward direction against the surface; continuing moving the gauge in a downward direction to a first reference point; measuring the force of the gauge against the surface; continuing moving the gauge in a downward direction to a second reference point; and measuring the force of the gauge against the surface.

Yet another aspect of the invention is directed to a method of calibrating a squeegee blade force against a stencil in a stencil printer. The method comprises: (a) removing a stencil from a stencil printer; (b) removing squeegee blades from the stencil printer; (c) attaching a gauge to a bottom of a print head; (d) moving the gauge to detect a first position and a second position; and (e) recording a force parameter associated with first position and a force parameter associated with the second position. An embodiment of the method further comprises: (f) loading the stencil into the stencil printer; (g) removing the gauge; (h) re-installing the squeegee blades to the stencil printer; (i) moving at least one squeegee blade to contact the stencil; (j) moving the at least one squeegee blade to the first position and to the second position; (k) recording a force parameter associated with the first position and a force parameter associated with the second position; and (l) calculating and applying a desired print force based upon an interpretation of the calibrated positions of first and second force values and actual positions of the first and second force values with the at least one squeegee blade in place.

Another aspect of the invention is directed to a print head to deposit and print viscous material over the stencil. The print head comprises a frame, at least one squeegee blade, a first movable member coupled to the frame, a second movable member coupled to the first movable member and to the at least one squeegee blade, the first and second movable members being configured to move the at least one squeegee blade from a raised position in which the at least one squeegee blade is spaced from stencil and a lowered position in which the at least one squeegee blade engages and applies a force on the stencil, a flag secured to one of the first movable member and the second movable member, and a sensor secured to the other of the first movable member and the second movable member. The sensor is configured to detect the flag when moving the at least one squeegee blade. The flag and sensor are configured to detect a first reference point associated with a first force of the at least one squeegee blade against the stencil and a second reference point associated with a second force of the at least one squeegee blade against the stencil when moving the at least one squeegee blade to the lowered position.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

Figure 1:
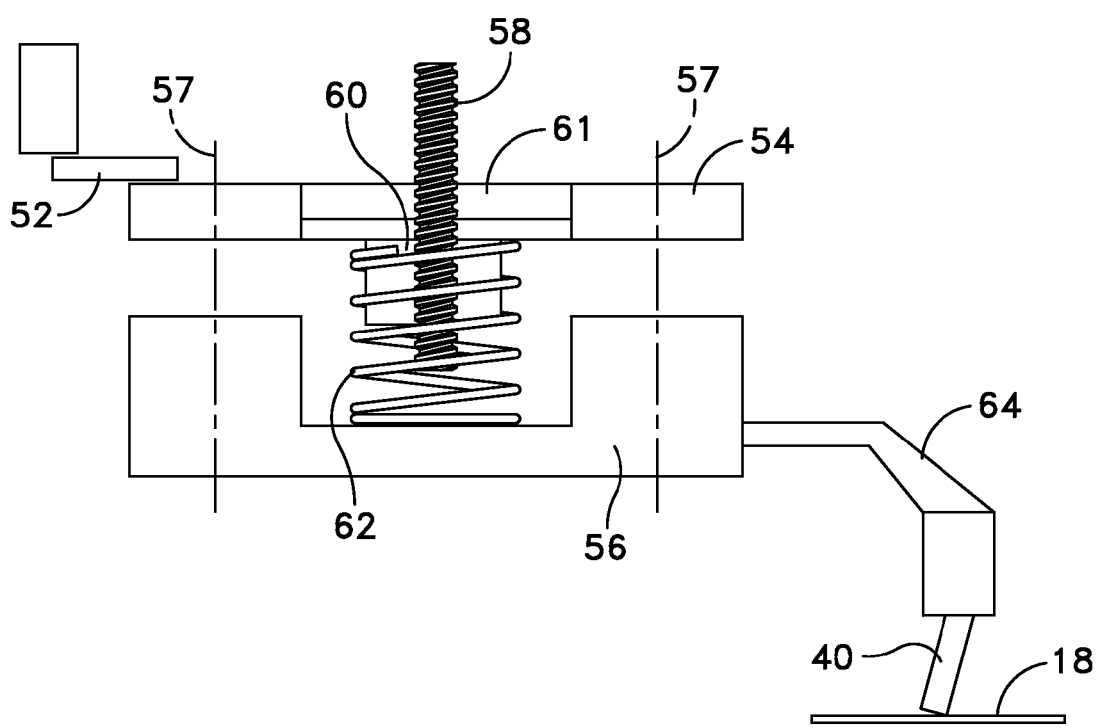
FIG. 1 is a schematic view of a prior art print head assembly.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the invention will now be described with reference to a stencil printer used to print solder paste onto a printed circuit board. One skilled in the art will appreciate, however, that embodiments of the invention are not limited to stencil printers for printing solder paste, but may also include printing other materials, such as adhesives, epoxies, underfill materials and encapsulant materials. Also, the terms screen and stencil may be used interchangeably herein to describe a device in a printer that defines a pattern to be printed onto a substrate.

Figure 2:
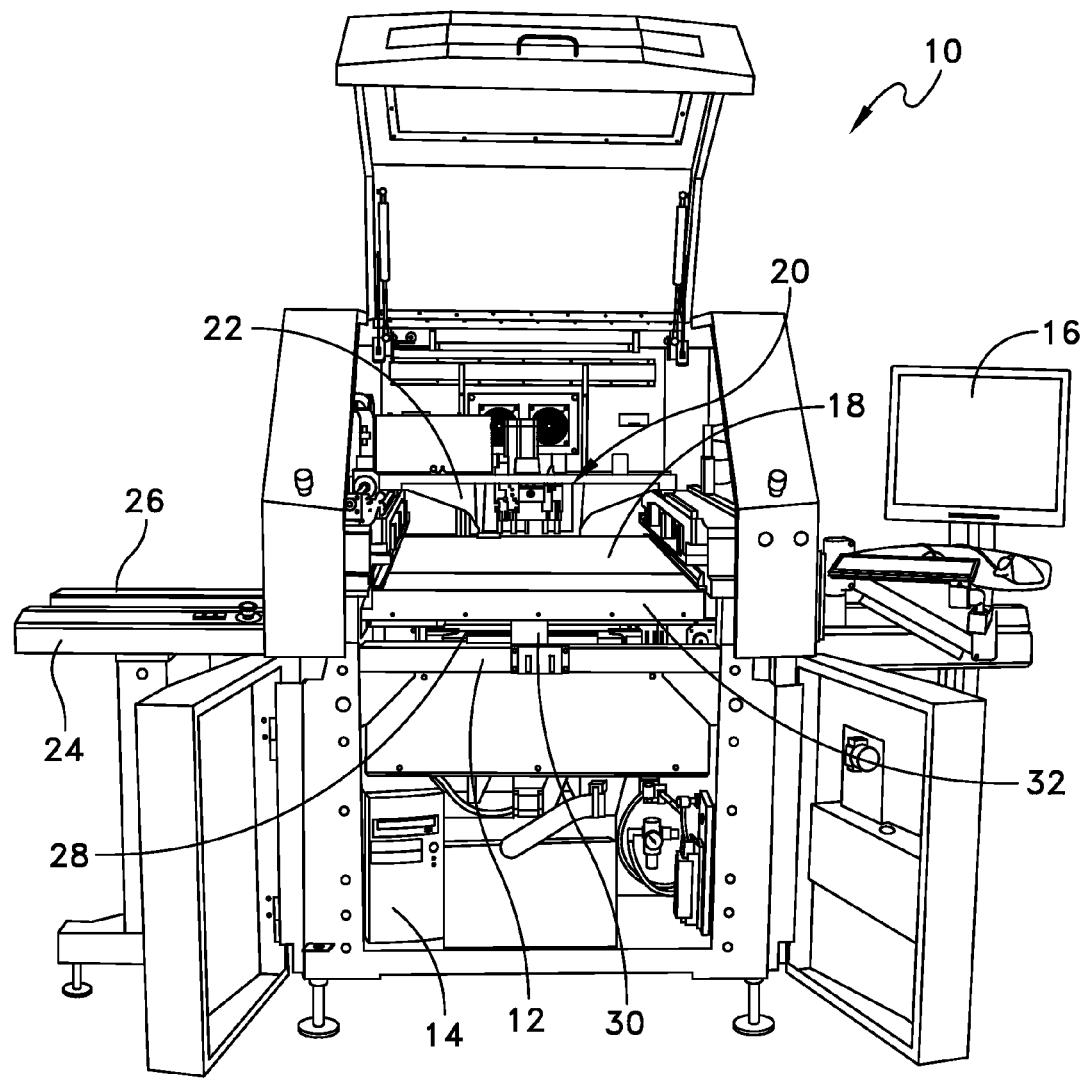
FIG. 2 is a front perspective view showing a stencil printer of an embodiment of the invention.

Referring now to the drawings, and more particularly to FIG. 2, there is generally indicated at 10 a stencil printer of an embodiment of the invention. As shown, the stencil printer 10 includes a frame 12 that supports components of the stencil printer. The components, in part, may include a controller 14, a display 16, a stencil 18, and a print head assembly or print head generally indicated at 20 configured to apply the solder paste. Each of these components may be suitably coupled to the frame 12. In one embodiment, the print head 20 is embedded within on a print head gantry 22, which enables the print head to be moved in the y-axis direction under the control of the controller 14. As described below in further detail, the print head 20 may be placed over the stencil 18 and a front or rear squeegee blade of the print head may be lowered in the z-axis direction into contact with the stencil. The gantry then may be moved across the stencil to allow printing of solder paste onto a circuit board.

Stencil printer 10 may also include a conveyor system having rails 24, 26 for transporting a circuit board to a print position in the stencil printer. The stencil printer 10 has a support assembly 28 to support the printed circuit board (or "substrate"), which, as will be described in greater detail below, raises and secures the printed circuit board so that it is stable during a print operation. In certain embodiments, the substrate support assembly 28 may further include a particular substrate support system, e.g., a solid support, a plurality of pins or flexible tooling, positioned beneath the circuit board when the circuit board is in the print position. The substrate support system may be used, in part, to support the interior regions of the circuit board to prevent flexing or warping of the circuit board during the print operation.

In one embodiment, the print head 20 may be configured to receive solder from a source, such as a dispenser, e.g., a solder paste cartridge, that provides solder paste to the print head during the print operation. Other methods of supplying solder paste may be employed in place of the cartridge. In one embodiment, the controller 14 may be configured to use a personal computer having a Microsoft DOS or Windows XP operating system with application specific software to control the operation of the stencil printer 10. The controller 14 may be networked with a master controller that is part of a line for fabricating circuit boards.

In one configuration, the stencil printer 10 operates as follows. A circuit board is loaded into the stencil printer 10 using the conveyor rails 24, 26. The support assembly 28 raises and secures the circuit board to a print position. The print head 20 then lowers the desired squeegee blade of the print head in the z-axis direction until squeegee blade of the print head contacts the stencil 18. The print head 20 is then moved in the y-axis direction across the stencil 18. The print head 20 deposits solder paste through apertures in the stencil 18 and onto the circuit board. Once the print head has fully traversed the stencil 18, the squeegee blade is lifted off the stencil and the circuit board is lowered back onto the conveyor rails 24, 26. The circuit board is released and transported from the stencil printer 10 so that a second circuit board may be loaded into the stencil printer. To print on the second circuit board, the other squeegee blade is lowered in the z-axis direction into contact with the stencil and the print head 20 is moved across the stencil 18 in the direction opposite to that used for the first circuit board.

Still referring to FIG. 1, an imaging system 30 may be provided for the purposes of aligning the stencil 18 with the circuit board prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. The construction of the imaging gantry 32 used to move the imaging system 30 is well known in the art of solder paste printing. The arrangement is such that the imaging system 30 may be located at any position below the stencil 18 and above the circuit board to capture an image of predefined areas of the circuit board or the stencil, respectively. In other embodiments, when positioning the imaging system outside the printing nest, the imaging system may be located above or below the stencil and the circuit board.

Figure 3:
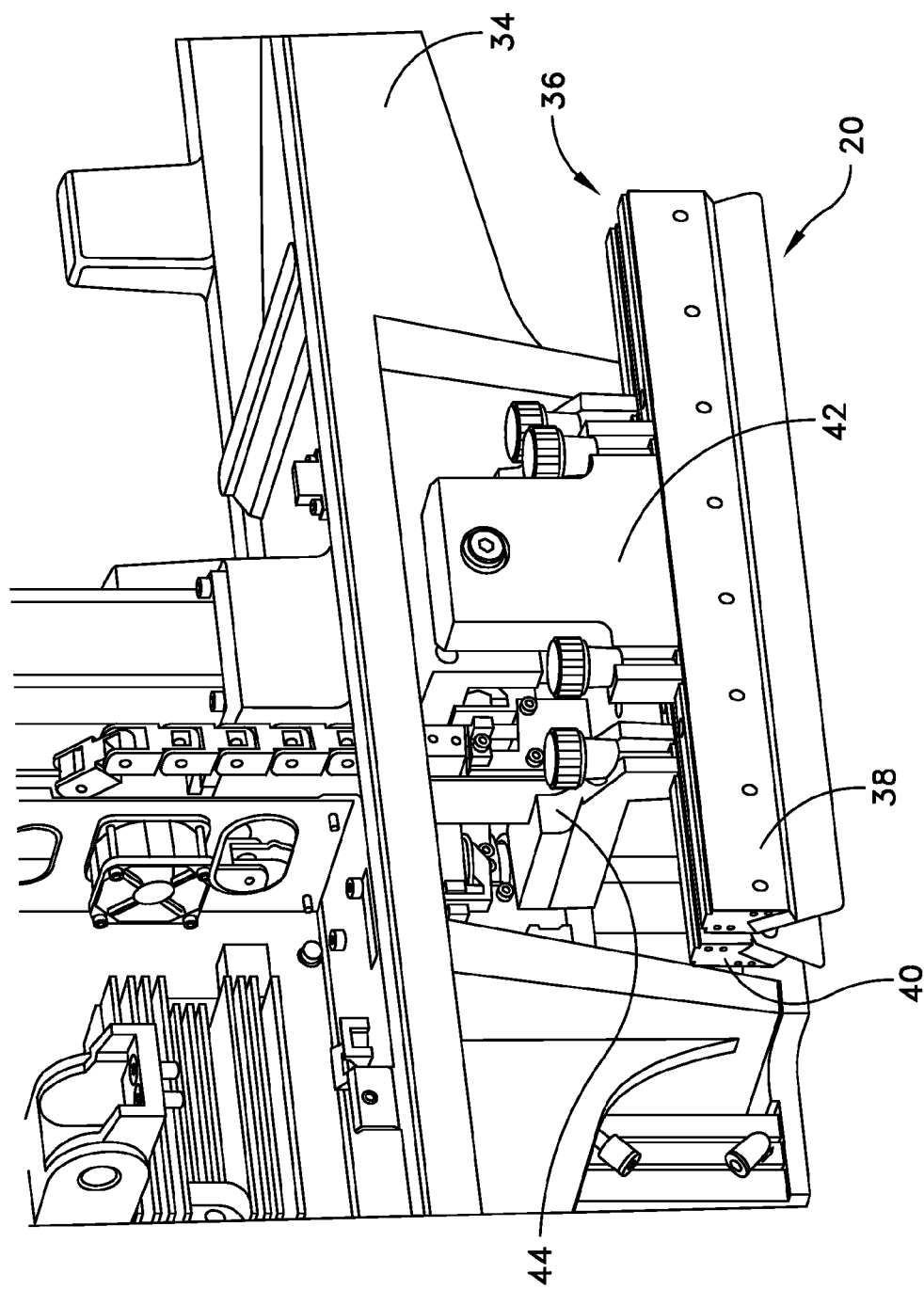
FIG. 3 is a perspective view of the stencil printer shown in FIG. 2 showing a print head assembly of an embodiment of the invention.
Figure 4:
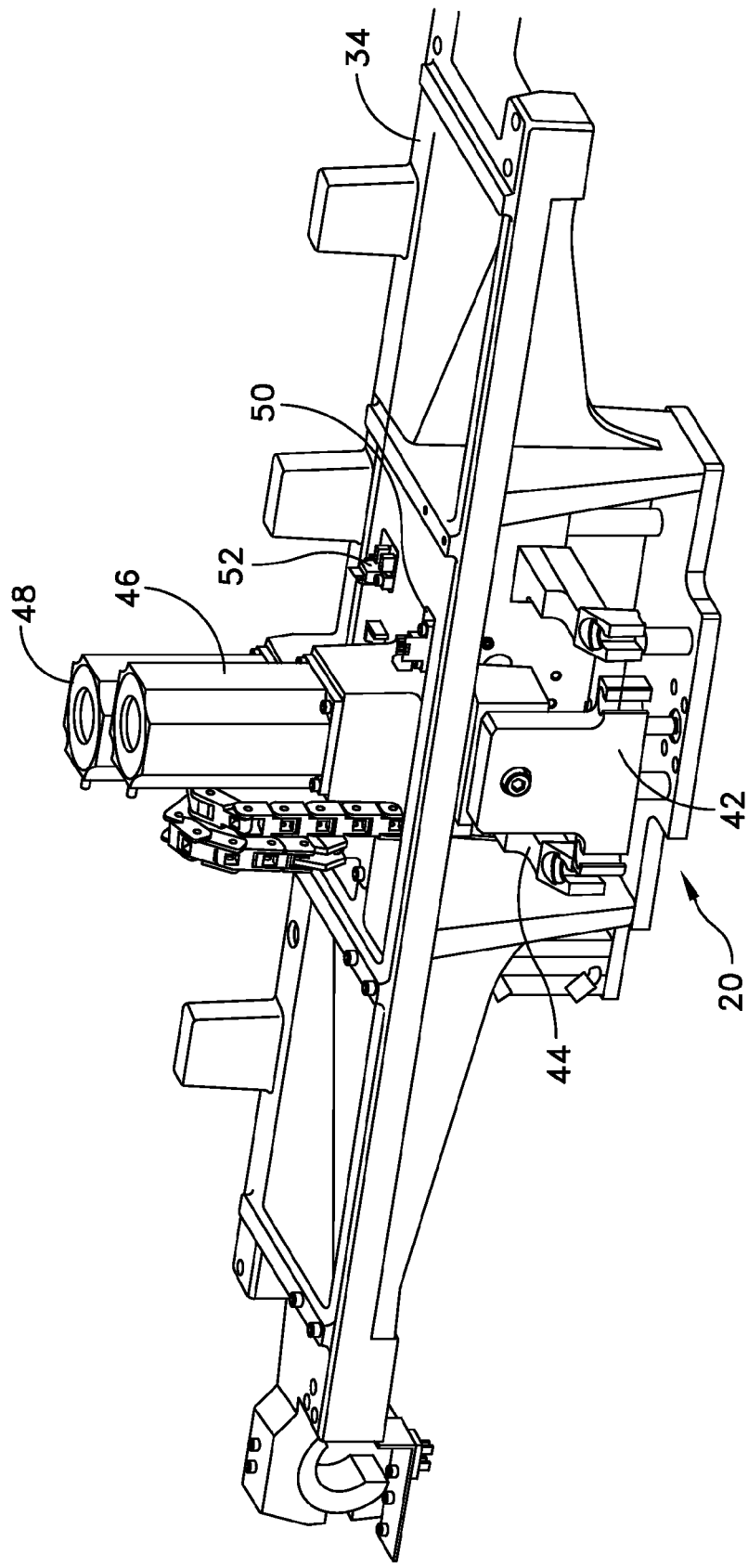
FIG. 4 is a perspective view of the print head assembly shown in FIG. 2 with squeegee blades being removed to more clearly show movable members of the print head assembly.

Referring now to FIGS. 2-4, the print head includes a frame 34 that becomes the gantry 22 when the print head 20 is installed so that the frame moves along a print direction, e.g., the y-axis direction. Specifically, the frame 34 is configured at its opposite ends to ride along linear rails of the frame 12 of the stencil printer 10. This construction provides y-axis direction of movement of the print head gantry 22. The frame 34 supports a squeegee assembly generally indicated at 36 having a pair of squeegee blades 38, 40 and a z-axis motion assembly configured to independently move the squeegee blades from a raised position in which the squeegee blades are spaced from the stencil to a lowered position in which the squeegee blades engage the stencil 18. As best illustrated in FIG. 3, the squeegee assembly 36 further includes a front mount assembly 42 to mount the front squeegee blade 38 and a rear mount assembly 44 to mount the rear squeegee blade 40. The front and rear squeegee blades 38, 40 are moved by motors 46, 48, respectively, mounted on the top of the frame 34. The arrangement is such that the front and rear squeegee blades 38, 40 may be independently lowered in the z-axis direction by the motors 46, 48, respectively, when performing print strokes with the squeegee blades. The squeegee assembly 36 further includes sensors 50, 52 for detecting the home (i.e., raised) location of the front and rear squeegee blades 38, 40, respectively.

When each squeegee blade 38 and 40 is lowered onto the stencil 18, the squeegee blade exerts a force on the stencil. This force is suitable for performing a print stroke so that solder paste is rolled by the squeegee blade and forced through apertures formed in the stencil. This solder paste is deposited on the circuit board when separating the stencil 18 from the circuit board by lowering the support assembly 28. The force of the squeegee blade on the stencil must be sufficient to force solder paste (or any other viscous material) through the apertures formed in the stencil, but not too great so as to damage the stencil.

Figure 5:
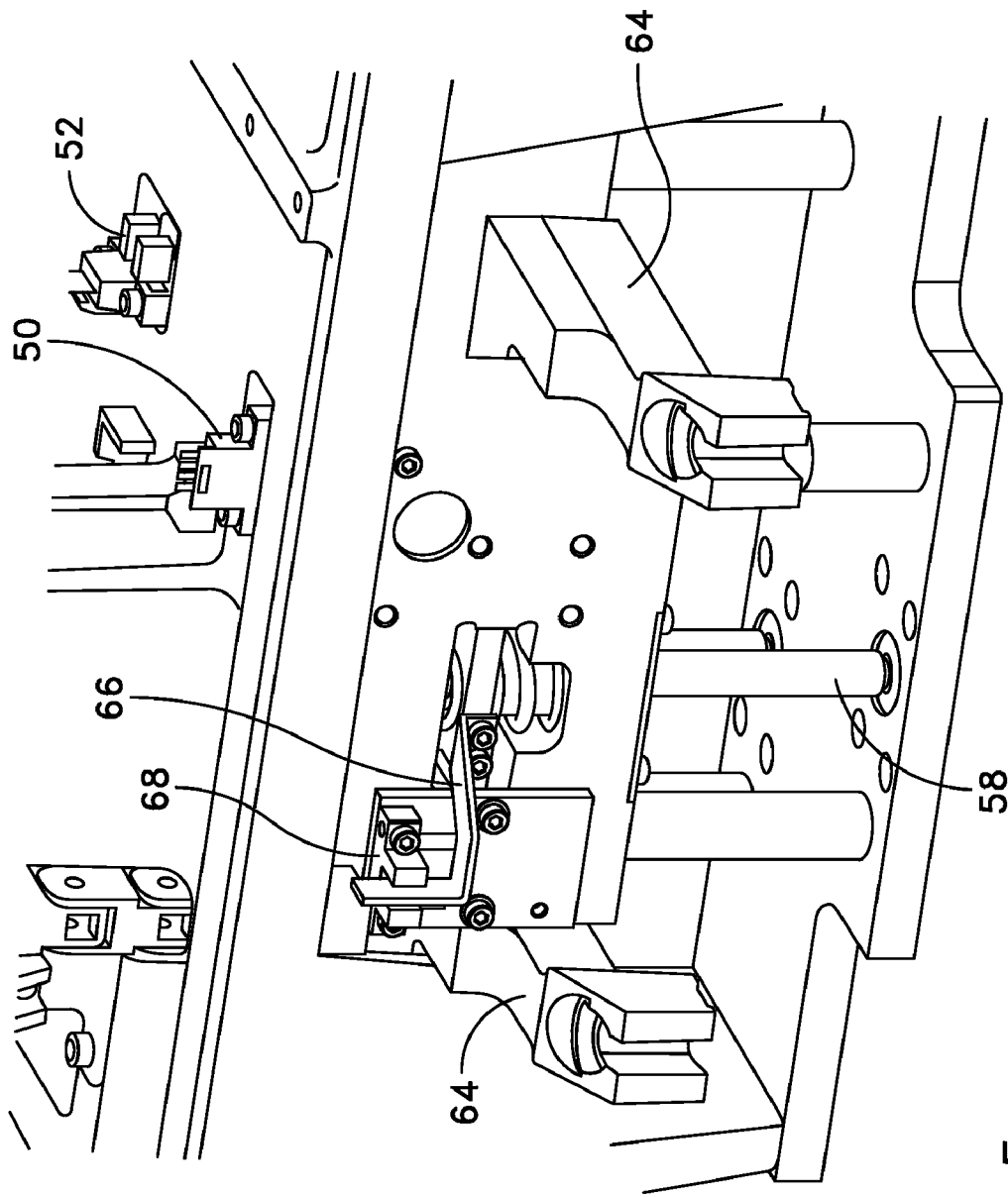
FIG. 5 is an enlarged perspective view of the print head assembly with selected parts removed.
Figure 6:
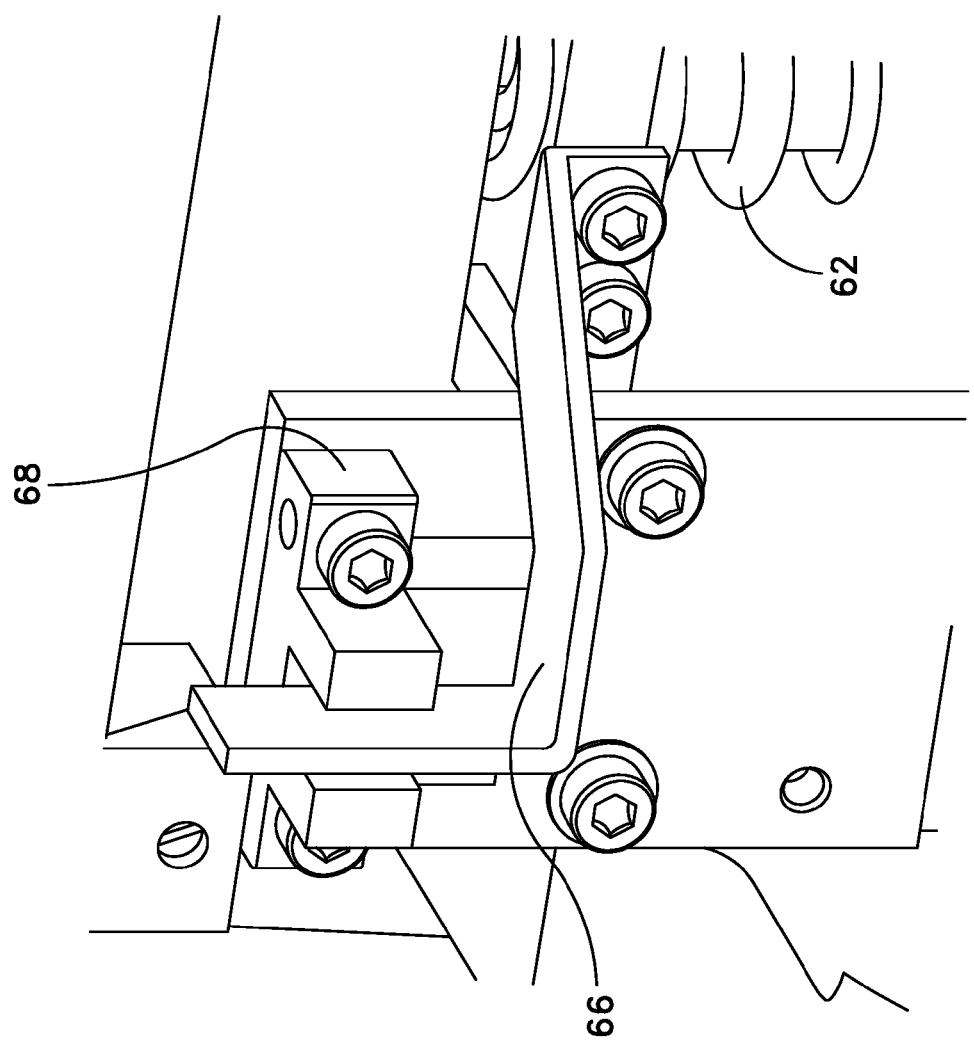
FIG. 6 is an even further enlarged perspective view of a sensor flag of the print head assembly.
Figure 7:
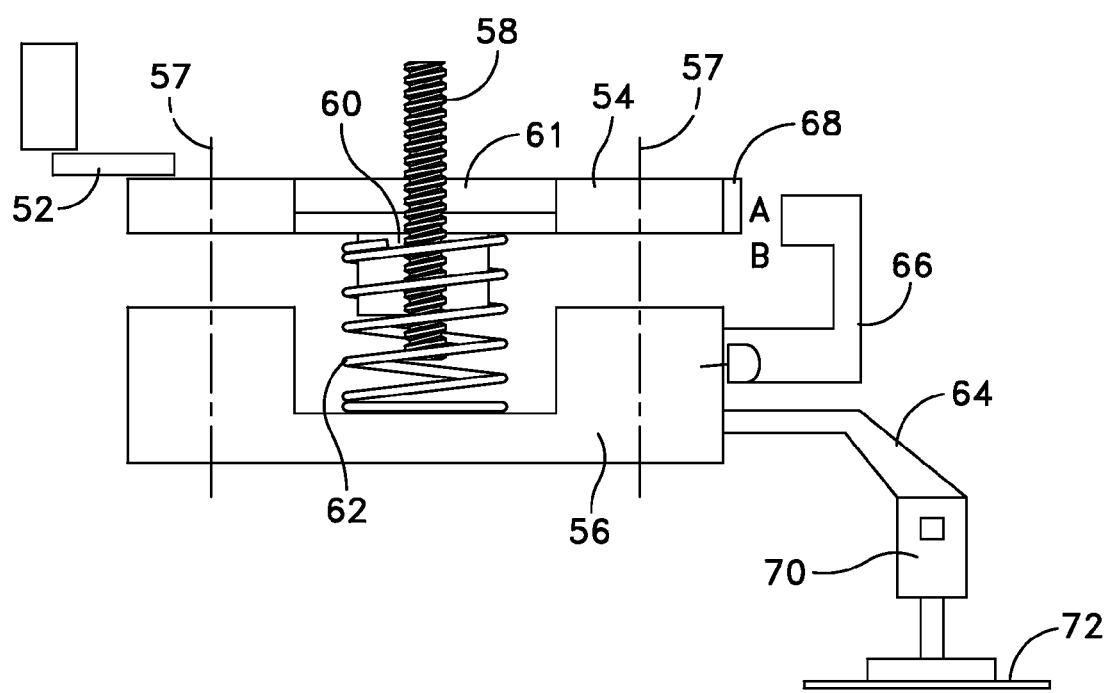
FIG. 7 is a schematic view of a squeegee blade (front or rear) of the print head assembly of an embodiment of the invention.

Referring to FIGS. 5-7, for each squeegee blade, e.g., the rear squeegee blade 40, a squeegee blade movement mechanism is configured to move the squeegee blade from a raised position in which the squeegee blade is spaced from stencil 18 and a lowered position in which the squeegee blade engages the stencil. With particular reference to FIG. 7 (also shown in FIG. 1), the squeegee blade movement mechanism comprises a first movable member 54 coupled to the frame 34 of the print head 20 coupled by the two linear bearings 57, and a second movable member 56 coupled to the first movable member by the two linear bearings 57 and associated springs. A lead screw 58, driven by one of the motors, e.g., motor 48, is housed on the frame 34. The lead screw 58 threadably engages a lead nut 60, which secured to the first movable member 54 to move the first and second movable members between the raised and lowered positions. An anti-rotation plate 61 is provided to prevent the rotation of the assembly when driving the lead screw 58. A compression spring 62 is disposed around the lead screw 58 to provide a resistance force between the first movable member 54 and the second movable member 56.

The arrangement is such that the motor 48 drives the first movable member 54 in a downward direction (along linear bearings 57). This results in the movement of the first and second movable members 54, 56 being moved together. As soon as the squeegee blade 40 contacts the stencil 18, the compression spring 62 begins to compress resulting in the movable members 54, 56 moving closer together thereby applying a print force on the squeegee blade. The compression spring 62 provides a resistance to the movement of the first and second movable members 54, 56 toward one another under print force application. As shown in FIG. 3, a squeegee blade holder 64 is configured to secure the squeegee blade 40 to the second movable member 56.

As described above, sensors 50, 52 are provided for detecting the positioning of the front and rear squeegee blades 38, 40 in their home positions. In order to gauge the force of a squeegee blade, e.g., the rear squeegee blade 40, against the stencil 18, a device is provided to detect a first reference point associated with a first force of the squeegee blade against the stencil and a second reference point associated with a second force of the squeegee blade against the stencil when moving the squeegee blade to the lowered position. Specifically, the device comprises a flag 66 secured to the second movable member 56 and a sensor 68 secured to the first movable member 54. Of course, the arrangement may be such that the flag 66 is secured to the first movable member 54 and the sensor 68 is secured to the second movable member 56. The sensor 68 is configured to detect the flag 66 when moving the squeegee blade to track at least two positions of distance between the first and second movable members 54, 56. Referring specifically to FIGS. 5 and 6, the flag 66 is fabricated from bent metal and is configured to move between a slot formed in the sensor 68. The flag 66 and the sensor 68 may be secured to their respective first and second movable members by fasteners, such as machine bolts.

Referring particularly to FIG. 7, the first and second reference points A, B are associated with the flag 66. The calibration or determination of the particular forces associated with reference points A, B is as follows. To calibrate the force of the engagement of a particular squeegee blade 38 or 40 against the stencil 18, a first step of a calibration routine is to replace the squeegee blade with a force/calibration gauge 70, which is provided to measure the force of a squeegee blade against the stencil by moving the gauge to the lowered position. Also, the stencil is removed from the stencil printer. The gauge 70 is lowered until it touches a rigid surface, such as a table or tooling top 72. The squeegee blade movement mechanism continues to lower the gauge 70 in known increments. At each known increment, the gauge 70 records the force value, which is saved by the controller 14 within a processor configured to have squeegee force calibration routine, for example. An example of recorded values is as follows:

| Steps of Motion | Force |
| --- | --- |
| 0 | 0 |
| 1000 | 1 lb |
| 2000 | 2 lbs |
| 3000 | 3 lbs |
| 50,000 | 50 lbs |

Next, the squeegee blade holder 64 is returned to the raised or starting position (at 0 steps of motion). The gauge 70 is lowered until the "A" edge of the flag 66, which corresponds to reference point A in FIG. 7, first triggers the sensor 68. This force is recorded and stored within the processor of the controller 14. The gauge 70 is further lowered until the "B" edge of the flag 66, which corresponds to reference point B in FIG. 7, triggers the sensor 68. This force is recorded and stored within the controller 14. The result is that the recorded forces correspond to the level of compression of the compression spring 62, which is linear and repeatable.

Next, the operator removes the gauge 70 and installs the squeegee blade 40 onto the blade holder 64. The squeegee blade 40 is lowered until it touches the stencil 18 to determine a zero reference point. The squeegee blade is further lowered until the "A" and "B" edges of the flag 66 are detected. These positions are compared to the reference points A and B determined above to calculate the curve for the printing force of the specific squeegee blade. In another embodiment, this two-step process may be combined into a single process. Specifically, the system may be configured to start at a zero position and drive down the known increments through transition points A and B. The force values for all increments and transition points are recorded for future reference.

In a certain embodiment, the flag 66 may embody a metal flag that is mounted to a fixed portion of the second movable member 56. In one embodiment, the flag 66 contains two small notches, e.g., approximately 1 mm in size, that are used to trigger the sensor 68. These notices may correspond to the "A" and "B" edges described above. The sensor 68 may embody an optical interruption style sensor mounted to the floating portion of the first movable member.

As discussed, the calibration of the print head may embody two separate operations. Prior to the shipping of the stencil printer, a calibration routine is performed to characterize the squeegee head assembly without the squeegee blades being installed. This calibration routine generates calibration data that will reflect a linear relationship of force asserted by the squeegee blades on the stencil. The second operation is a user-initiated squeegee blade force correction operation. In one embodiment, this is a fully automatic correction operation, which may be done after the squeegee blades are installed or changed by an operator.

With prior stencil printers, in order to obtain consistent and repeatable print force data on both squeegee blades, an operator would need to set the blades with different forces for the front blade and on the rear blade. The reason for the difference in the applied forces was due to the compliance in the squeegee blades and the nonlinear configurations of the print heads. Once the blades are attached to the stencil printer, a squeegee blade spring compliance compensation calibration is introduced to the squeegee head assembly. This introduced compliance compensation calibration may require an additional correction step that a user can run (fully automatically) when the squeegee blades are installed or changed. Once an operator runs a squeegee compliance correction routine, the data collected may be projected onto the manufacturing data to generate the corrected squeegee head z-axis displacement for achieving a desired force on the stencil.

In one embodiment, the z-axis print force may be between 0 lbs and 44 lbs (0 kg and 20 kg), with a software setting resolution of 0.1 lb (0 kg). With standard squeegee blades, e.g., and open-loop print head, the print force repeatability may equal approximately +/−1 lb (0.45 kg). Any number of data points may be taken to obtain an accurate characterization of the force of the squeegee blades across and beyond the 1 mm gap, for example, to achieve a desired resolution and force.

For example, the following approach may be employed to obtain the desired values. This approach may be used if the mechanical system is determined to be linear. Below, assume that the following positions ($Pos_n$) and forces have been calibrated:

CalValue1—$Pos_1$ (0 mm=Force 0 lbs)
CalValue2—$Pos_2$ (1 mm=Force 4 lbs)
CalValue3—$Pos_3$ (2 mm=Force 10 lbs)
CalValue4—$Pos_4$ (3 mm=Force 20 lbs)
CalValue5—$Pos_5$ (4 mm=Force 44 lbs)

If the system is requested to apply a force of 7 lbs, the following analysis may be used to determine the interpolated position to move to:

First, the system must locate where the requested force falls for the above-identified calibrated values. In this example, the force falls between CalValue2 and CalValue3. Next, the system may employ the following equation:

$$\text{Interpolated Position} = Pos_n + ((\text{Force}_{(Pos\ n+1)} - \text{Force}_{(Pos\ n)})/\text{RequestedForce}) \quad (1)$$

where n=2

Thus, for the given example, the Interpolated Position is equal to 1.857 mm, which is derived by performing the following calculation: 1 mm+((10−4)/7)=1.857 mm To factor for errors, the controller may determine the force expected at the first transition point, i.e., the "A" location, and the force expected at the second transition point, i.e., the "B" location. For example, for location "A," a minimum/maximum force may be between 1 lb and 5 lbs. Thus, any force less than or more than this amount may be considered as an error wherein the operator is immediately notified and the calibration test is aborted.

As described above, the print head may be manually calibrated using an external force gauge, such as gauge 70. Measurements of force (or pressure if using a pressure sensor) may be taken at specified squeegee head displacements in the z-axis direction. From this information a mapping is created between the displacement down and the force read off of the force meter. The calibration process may be broken into two phases. The first phase locates the first and second transition points on the flag known as location "A" and "B." These locations establish an accurate force at two locations for establishing a linear compensation curve for applying compliance compensation during a subsequent print process. The second phase of the calibration process consists of driving the squeegee head down at fixed distance intervals throughout the required calibrated range for the print head and reading the force applied at each interval.

The first phase begins by testing the state of the sensor, which must be in an "off" position in order to start the process. If the sensor is not in the "off" position, an operator may be able to jog the squeegee blade down too much in z-axis direction, or there may be a mechanical issue that needs to be addressed. There should be very little or no down force of the squeegee blade on the stencil before calibration starts. Next, the selected squeegee blade is moved under the operation of the controller at a jog velocity of 2 mm/sec (starting course movement) until the "A" location is detected. Once detected, the sensor will transition from an "off" position to an "on" position.

Next, a downward z-axis movement of 0.25 mm will be issued to move into a 1 mm gap area to search for the "B" location. The process of detecting the "B" location applies the same approach as was used to detect the "A" location. The value for the "B" location point is also recorded. In the event that a transition is not seen, the system will error out by reaching a software limit Once both "A" and "B" locations are found the squeegee will reset to the zero force position so that calibration of interval forces across the flag can start.

The second phase begins at the end of the first phase by driving the gauge down at fixed intervals. The range of travel will consist of a preset number of points that will span beyond the "A" and "B" locations. At each interval the force displayed on the force meter will be entered by the operator.

Thus, the first phase of the calibration process of the squeegee blades may be summarized as follows:
(a) initialize stencil printer;
(b) remove stencil from the stencil printer;
(c) remove the attached squeegee blades;
(d) locate the print head over the center of the substrate support;
(e) attach a force gauge to the bottom of the print head;
(f) turn on and set the force gauge;
(g) jog the substrate support up slowly until it comes in contact with the force gauge;
(h) zero out the force gauge;
(i) enter a desired number of calibration intervals across entire range of travel;
(j) start the sequence;
(k) move the force gauge to detect the "A" location and the "B" location on the flag, and return the force gauge to the zero force location;
(l) enter the force values as the squeegee head is driven down through each interval;
(m) at the last interval, raise the squeegee head; and
(n) save the force and position data to the processor of the controller.

Whenever a situation arises in which the squeegee blades are changed, the operator will be given the opportunity to level the squeegee blades to determine the z-axis height point at which the squeegee blade contacts the stencil for that specific squeegee blade. As part of this operation, the system will automatically adjust for the squeegee blade compliance. There may be some instances in which the stencil printer is configured in a manner where some tooling will not be compatible with the compliance routine. In these situations, the stencil printer may be configured so that the compliance compensation routine may not occur automatically—the operator will be prompted to perform the routine, if desired. In the instances in which the operator does not want to perform the compliance compensation routine, the stencil printer may be configured to perform the operation without the accuracy afforded by performing the compliance compensation routine. Specifically, an operator will be presented with an option on the display to select an "Auto Squeegee Force Correction." When selected, the system will warn the operator to make sure that both squeegee blades are installed and that a stencil is loaded. The operator may be warned that the loaded squeegee blades must be capable of handling a certain force, such as a force of up to 25 lbs.

In either the automatic or the manual instance of the compliance calibration process, the second phase of the calibration process of the squeegee blades may be summarized as follows:
(a) the stencil is loaded into the stencil printer;
(b) the squeegee blades are both reinstalled;
(c) the operator moves the squeegee head over the center of the stencil;
(d) the substrate support (and printed circuit board) are moved to the print position below stencil as they will be during this specific print process;

(e) the front (or rear) squeegee blade is selected;

(f) the squeegee head is moved to a home position;

(g) the front squeegee blade is lowered to print height, i.e., so that the front squeegee blade contacts the stencil;

(h) the front squeegee is driven down (lowered) into the stencil until the sensor detects the "A" position of the flag and automatically records the squeegee blade z-axis height for this transition point;

(i) the front squeegee will continue to be driven down into the stencil until the sensor detects the "B" location of the flag and automatically records the squeegee blade z-axis height for this transition point;

(j) the front blade data is saved into the database of the processor of the controller; and (k) this process is repeated for the rear (or front) squeegee blade.

A squeegee force correction factor may be calculated and stored in a database each time a user-initiated squeegee force correction sequence is executed. The correction factor also may be stored in a recipe file since it will likely be consistent for the next time the same squeegee blades are used for a specific product. A correction value is stored for the front and rear squeegee blades. When a squeegee force is requested, the manufacturing calibration data may be scaled using the correction factor to determine the force displacement value.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. For example, the parameters described herein may be modified to accommodate different printing process requirements. Accordingly, the foregoing description and drawings are by way of example only.

What is claimed is:

1. A method of calibrating a squeegee blade force against a stencil in a stencil printer, the method comprising:
   removing a stencil from a stencil printer;
   removing squeegee blades of a squeegee assembly of the stencil printer, the squeegee assembly comprising a squeegee blade movement mechanism configured to move the squeegee blades from a raised position in which the squeegee blades are spaced from the stencil and a lowered position in which the squeegee blades engage and apply a force on the stencil;
   attaching a gauge to a bottom of a print head;
   moving the gauge by the squeegee blade movement mechanism to detect a first position and a second position by engaging the gauge to a surface;
   recording a force parameter associated with the first position and a force parameter associated with the second position;
   determining a calibrated position for each of the first and second force values; and
   calculating and applying a desired print force based upon the calibrated positions of the first and second force values and actual positions of the first and second force values as detected by the gauge with at least one squeegee blade in place.

2. The method of claim 1, further comprising:
   loading the stencil into the stencil printer;
   removing the gauge;
   re-installing the squeegee blades to the stencil printer;
   moving the at least one squeegee blade to contact the stencil;
   moving the at least one squeegee blade to the first position and to the second position; and
   recording a force parameter associated with the first position and a force parameter associated with the second position.

3. A method of calibrating a squeegee blade force against a stencil in a stencil printer, the method comprising:
   moving a gauge in a downward direction against the stencil with a squeegee assembly including removable squeegee blades that are replaced with the gauge and a squeegee blade movement mechanism configured to move the squeegee blades from a raised position in which the squeegee blades are spaced from the stencil and a lowered position in which the squeegee blades engage and apply a force on the stencil;
   continuing moving the gauge in a downward direction to a first reference point;
   measuring the force of the gauge against the stencil for a first force value;
   continuing moving the gauge in a downward direction to a second reference point;
   measuring the force of the gauge against the stencil for a second force value;
   determining a calibrated position for each of the first and second force values; and
   calculating and applying a desired print force based upon the calibrated positions of the first and second force values and actual positions of the first and second force values as detected by the gauge with at least one squeegee blade in place.

4. A method of calibrating a squeegee blade force against a stencil in a stencil printer, the method comprising:
   removing a stencil from a stencil printer;
   removing squeegee blades of a squeegee assembly of the stencil printer, the squeegee assembly comprising a squeegee blade movement mechanism configured to move the squeegee blades from a raised position in which the squeegee blades are spaced from the stencil and a lowered position in which the squeegee blades engage and apply a force on the stencil;
   attaching a gauge to a bottom of a print head;
   moving the gauge by the squeegee blade movement mechanism to detect a first position and a second position by engaging the gauge with a surface;
   measuring a force parameter associated with the first position and a force parameter associated with the second position;
   determining a calibrated position for each of the first and second force values; and
   calculating and applying a desired print force based upon the calibrated positions of the first and second force values and actual positions of the first and second force values as detected by the gauge with at least one squeegee blade in place.

* * * * *